United States Patent [19]
Burbank et al.

[11] 4,109,192
[45] Aug. 22, 1978

[54] LOW POWER REACTIVE DRIVE CIRCUIT FOR CAPACITIVE LOADS

[75] Inventors: Ronald Brent Burbank, Olathe, Kans.; Bruce S. Eisenhart, Agoura, Calif.; James R. Hall, Cypress, Calif.; James M. Hamilton, Hawthorne, Calif.

[73] Assignee: Hughes Aircraft Company, Culver City, Calif.

[21] Appl. No.: 699,924

[22] Filed: Jun. 25, 1976

[51] Int. Cl.² .............................................. H03K 3/53
[52] U.S. Cl. ........................................ 320/1; 307/108
[58] Field of Search ..................... 320/1; 307/109, 108

[56] References Cited
U.S. PATENT DOCUMENTS 3,439,254  4/1969  Forster et al. ............................ 320/1

*Primary Examiner*—Stuart N. Hecker
*Attorney, Agent, or Firm*—Lawrence V. Link, Jr.; W. H. MacAllister

[57] ABSTRACT

A circuit for driving capacitive loads which utilizes the temporary storage characteristics of an inductor in a resonant LC configuration to force current to flow from a low potential location to a high potential location at selected switching times. The circuit is controlled by an externally activated switching network in series with the inductor and capacitive load which network comprises two unidirectional conducting branches oriented to allow current flow in opposite directions through the respective branches. By appropriately opening and closing switches in the two branches, the switching network can regulate the flow of current through the inductor to either charge or discharge the capacitive load without the necessity of dissipating energy when the capacitive load is either charged or discharged. Components are also included for replacing the inherent power losses of the circuit.

5 Claims, 11 Drawing Figures

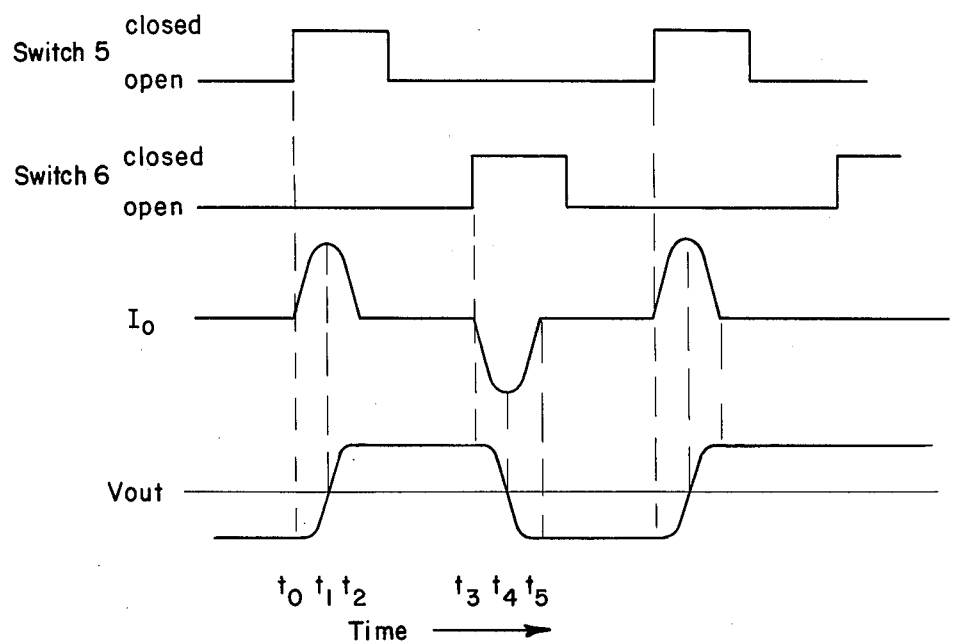
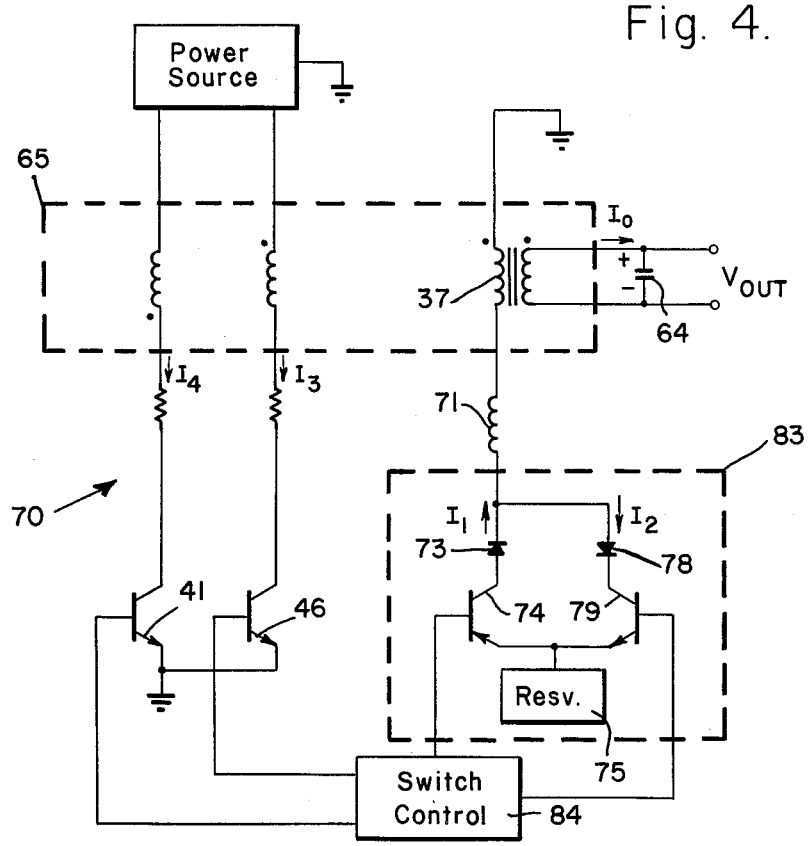

LOW POWER REACTIVE DRIVE CIRCUIT FOR CAPACITIVE LOADS

BACKGROUND OF THE INVENTION

1. Field of the Invention

This invention relates generally to drive circuits for capacitive loads and more particularly to methods and apparatus for increasing the efficiency of drive circuits for capacitive loads utilizing an inductor and an externally controlled dual branch switching network.

2. Description of the Prior Art

In many circuit applications, it is necessary to drive a load with a square wave signal. When the load exhibits the characteristics of a capacitor, however, the load will acquire and hold the charge supplied on the initial rise of the square wave. It has thus been necessary to discharge the capacitive load so that it may be cyclically driven. The commonly used approach to achieve this result has been to drive the capacitive load with a circuit having a resistive or active pullup and an active pulldown. Such circuits supply current from a voltage to charge the capacitive load and short current to ground to discharge the capacitive load. While such circuits give the desired results, charging and then discharging the capacitive load dissipates considerable power, the magnitude of which can be shown to be greater than or equal to $C_1V^2f$, where $C_1$ is the capacitance of the capacitive load, V is the peak-to-peak voltage across the capacitive load, and $f$ is the frequency of the square wave driving signal.

The present invention, utilizing a reactive drive concept, greatly decreases or eliminates entirely the energy lost when the capacitive load is charged and discharged. This is accomplished by using an externally commanded switching network means to control the current flow between an energy reservoir and the capacitive load through an inductor. In response to a permissive state of the switching network means, current initially flows through the inductor to charge the capacitive load because the potential of the energy reservoir is above that of the capacitive load. Such current flow causes energy to be stored in the inductor. Once the capacitive load is charged to a potential equal to that of the energy reservoir, current is no longer induced to flow because of a difference in potential. However, the net current continues to flow, being induced by the release of the energy previously stored in the inductor. When the energy in the inductor is fully dissipated, the voltage across the capacitive load will be twice the voltage supplied by the energy reservoir and the current flow ceases.

When the switching network means allows the capacitive load to be discharged, the inductor again stores energy until the voltage across the capacitive load is equal to the voltage of the energy reservoir. The energy stored in the inductor is then utilized to maintain current flow, thereby siphoning the charge from the capacitive load and forcing it back into the energy reservoir where it is available to charge the capacitive load on subsequent cycles. Integral to this circuit is the externally controlled switching network means whereby the resonant characteristics of the LC combination may be controlled by allowing variations in characteristics of the square wave generated. Separate means are provided to restore the inherent energy losses of the circuit.

In a different context, this principle was utilized by Z. D. Farkas in his "Voltage Multiplying Inverter/Converter System," (U.S. Pat. No. 3,377,541). However, the various embodiments of the present invention make use of either one or two independently controlled single pole-single throw switches rather than a double pole-double throw switch as claimed by Farkas. Furthermore, the essence of the Farkas circuit is to utilize the energy stored by an inductor in a resonant LC circuit to boost the output voltage across a capacitor until the inherent losses in the circuit equal the energy supplied by the source. Consequently, energy is never returned to the source of any other energy reservoir. In fact, the placement of diode 41 (FIG. 4 of the Farkas invention) will prevent energy from ever returning to the only possible energy reservoir in the Farkas circuit, namely the power source.

Accordingly, it is the general object of the present invention to increase the efficiency of capacitive load driver circuits by retrievably storing energy which would otherwise be lost.

It is yet another object of the present invention to utilize the resonant characteristics of an LC circuit to force the capacitive load to discharge into an energy reservoir where the discharged energy can be used to recharge the capacitive load in subsequent cycles.

It is yet another object of the present invention to provide a means whereby the rise and fall times of a capacitive load driven by a square wave may be precisely controlled.

It is still another objective of the present invention to provide a driver circuit utilizable with all of the large variety of waveforms which may be used to clock charged coupled devices.

SUMMARY OF THE INVENTION

In accordance with the principles of the present invention, the above objects are accomplished by driving the capacitive load with a square wave signal such that power dissipation is minimized. This is achieved by forming a series resonant LC circuit which operates only during the desired square wave rise and fall times. Thus, when a fully charged capacitive load is discharged into an energy reservoir, current flows through the inductor causing energy to be stored therein. This current continues to flow and the inductor continues to store energy until the potential of the capacitive load reaches that of the energy reservoir at which time current will cease flowing as a result of a potential difference between the capacitive load and the energy reservoir. However, current flow is maintained by the release of energy stored in the inductor. When the energy stored in the inductor has been fully dissipated, the current tries to reverse itself and flow from the energy reservoir to the capacitive load because the potential of the energy reservoir is above that of the capacitive load. However, such reverse current flow is prevented by a switching network means responsive to switch control means. Thus, a voltage below the voltage of the energy reservoir is maintained across the capacitive load.

At a subsequent time, the state of the switching network means is changed by the switch control means allowing current, induced by the potential difference, to immediately flow from the energy reservoir through the inductor to the capacitive load. As on the previous half cycle, the inductor attains a maximum potential energy when the capacitive load is charged to a voltage equal to that of the energy reservoir. This potential energy is again utilized to draw energy from the energy reservoir to continue charging the capacitive load.

Thus, when the energy stored in the inductor has been fully dissipated, the voltage across the capacitive load will be higher than that of the energy reservoir and the current again tries to reverse and flow from the capacitive load to the energy reservoir. Again the switching network means will prevent such reverse current flow until a subsequent time when the cycle is again initiated by the switch control means. As can be seen, the capacitive load energy, i.e. energy supplied to charge the capacitive load or energy discharged from the capacitive load into an energy reservoir, is not lost in the charging and discharging process but is preserved in an energy reservoir which may be the power source or some other constant voltage reservoir.

Because of inherent circuit losses, a means is provided for inserting energy into the circuit, thereby allowing the capacitive load to receive and discharge the same amount of energy during each cycle. Thus, the total energy consumed by the circuit will be approximately equal to the power necessary to replace inherent component energy losses in the circuit itself. Substantial energy savings over conventional or nonreactive capacitive load driving circuits can consequently be realized.

BRIEF DESCRIPTION OF THE DRAWINGS

These, as well as other objects of the present invention, will become apparent when reading the ensuing description in which:

FIG. 2 is a graphical representation showing the open-closed sequence of the switches of the embodiment in FIG. 1 and the resultant current through the inductor and voltage across the capacitive load;

FIG. 4 is a schematic diagram of a modified version of the embodiment of FIG. 3;

DESCRIPTION OF THE PREFERRED EMBODIMENTS

Figure 1:
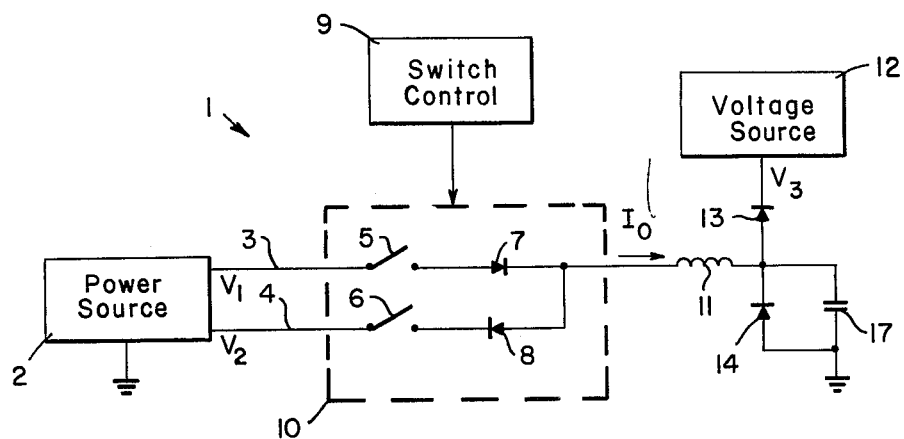
FIG. 1 is a schematic diagram of a preferred embodiment showing a reactive drive circuit where the energy reservoir is the power source.

Referring to FIG. 1, there is shown one embodiment of a reactive drive circuit generally designated by the numeral 1. The circuit consists of two terminals, 3 and 4, connected to a DC power source, 2, capable of supplying power to the circuit at two different voltages, $V_1$, and $V_2$. The terminals 3 and 4 are connected to a switching network generally designated by the numeral 10, which comprises two channels which join to form a single output connected to inductor 11. The first channel of the switching network 10, connected to terminal 3, comprises the series combination of a switch 5 and diode 7. The second channel of the switching network 10, connected to terminal 4, comprises the series combination of a switch 6 and diode 8. The open-closed sequence of switches 5 and 6 are controlled by switch control 9 to be described in greater detail hereinbelow. Inductor 11 is serially connected between switching network 10 and the capacitive load, 17, represented generally as a single capacitor.

Connected between the inductor 11 and the capacitive load 17 are two diodes, 13 and 14, to clamp the voltage excursions appearing across the capacitive load 17. To accomplish this result, diode 13 is connected between the inductor and capacitive load junction and first voltage source 12 at voltage $V_3$ approximately equal to $(V_1+V_2)/2$ so that current is allowed to flow from the capacitive load 17 through diode 13 into voltage source 12 if the voltage across capacitive load 17 is greater than the voltage $V_3$ of the voltage source 12. Diode 14 is connected between ground and the inductor and capacitive load junction and is oriented so that current is allowed to flow through diode 14 into capacitive load 17 if a negative voltage appears across the capacitive load 17. It will be appreciated that diode 14 may be connected to a second constant voltage source other than ground and that voltage source 12 may be at a voltage other than $(V_1+V_2)/2$ if it is desired to have a different voltage swing across the capacitive load 17 although $V_1+V_2$ should also be appropriately adjusted to minimize circuit losses. It will also be appreciated that diodes 13 and 14 and voltage sources 12 are unnecessary if precise control is not essential.

Referring to FIG. 2, the operation of the circuit represented in FIG. 1 commences with a command from switch control 9 which closes switch 5. Assuming, for purposes of explanation, that all circuit elements in the reactive drive circuit 1 are ideal devices, and that the reactive drive circuit 1 has no losses, voltage $V_1$ at terminal 3 and voltage $V_2$ at terminal 4 are equal. When switch 5 is closed at time $t_0$, a voltage step of magnitude $V_2$ is applied to the series circuit which comprises diode 7, inductor 11, and capacitive load 17. Current, $I_0$, through inductor 11 slowly builds up and reaches a peak at time $t_1$. At this time, the voltage, $V_{out}$, appearing across the capacitive load has a value $V_2$ and the energy stored in the capacitive load is one-half of the total energy which was supplied to the circuit. The other half of the supplied energy is consequently stored in inductor 11. Since the voltage across capacitive load 17 and the voltage of the power source 2 is the same, no further energy will be supplied by the power source 2. However, the inductor 11 continues to transfer its stored energy to capacitive load 17 until time $t_2$ when voltage, $V_{out}$, is equal to twice the source voltage $V_2$. Because there is a difference between the voltage across the capacitive load 17 and the voltage $V_2$ of power source 2, the current $I_0$ tries to reverse itself and flow from the capacitive load 17 through inductor 11 back through switch 5 to terminal 3 of power source 2. However, such current flow is blocked by diode 7. Thus, current $I_0$ through inductor 11 will remain at zero and the voltage across capacitive load 17 will remain at twice the source voltage until switch 6 is closed.

At a time $t_3$ subsequent to the opening of switch 5, switch 6 is closed. This allows the capacitive load 17 to discharge, causing current to flow from capacitive load 17 through inductor 11, diode 8, and switch 6 into terminal 4 of power source 2. Again, maximum potential energy will be stored in inductor 11 when the current through inductor 11 is maximum at time $t_4$ and when the voltage $V_{out}$ across the capacitive load 17 is equal to the voltage of the power source 2. After time $t_4$, the energy stored in the inductor 11 is returned to the circuit to maintain the flow of current, $I_0$, by which energy stored in the capacitive load 17 is transferred to the power source 2. Thus, the inductor acts as a siphon to draw energy from the capacitive load 17 and deposits it in the power source 2. When the potential energy stored in inductor 11 is dissipated, the voltage across the capacitive load 17 will be zero and the current will again attempt to reverse itself and flow from power source 2 through terminal 4 at voltage $V_2$ through switch 6 and inductor 11 to recharge capacitive load 17. However, diode 8 blocks such reverse current flow. Thus, the voltage of the capacitive load remains at zero until switch 5 is again closed subsequent to the opening of switch 6 by external switch control 9.

Assuming that there are no losses, the voltage $V_{out}$ across the capacitive load continues to swing between 0 volts and $2V_2$ volts. No power is dissipated because the current always returns to the same voltage source from which it came. Furthermore, the power source 2 in the present embodiment is the energy reservoir since it is both the source of current when the capacitive load is charged and the destination of current when the capacitive load is discharged.

With losses in the circuit, the voltage across the capacitive load would not quite reach twice the source voltage, $V_2$, and would not quite return to zero. Consequently, as the cycles continue, the voltage across the capacitive load 17 would decrease until it became a voltage equal to the source voltage $V_2$. In order to overcome this inoperable state, a means is provided to restore the inherent losses of the circuit to maintain maximum voltage swing across capacitive load 17. Thus, the voltage $V_1$ at terminal 3 of power source 2 is made higher than the voltage $V_2$ at terminal 4. If $V_1$ and $V_2$ are adjusted so that circuit losses are just overcome, the output voltage will swing from 0 volts to $V_1+V_2$ volts. However, if $V_1$ is adjusted higher or lower, then the output will adjust itself until the losses just equal the power supplied by the power source. In FIG. 1, diodes 13 and 14 have been added to clamp the output voltage excursions to the desired values. Thus, the voltage swing of capacitive load 17 will vary between ground and the voltage $V_3$ of voltage source 12. For circuit operations, $V_1$ and $V_2$ are adjusted so that $(V_1+V_2)/2$ is approximately halfway between $V_3$ and ground and the $V_1-V_2$ allows for inherent circuit losses. Diodes 13 and 14, while a source of additional losses, clamp the output voltage across the capacitive load 17 and cause a stable output waveform. It will be appreciated that switches 5 and 6 can comprise driven switching transistors as is known in the art.

Figure 3:
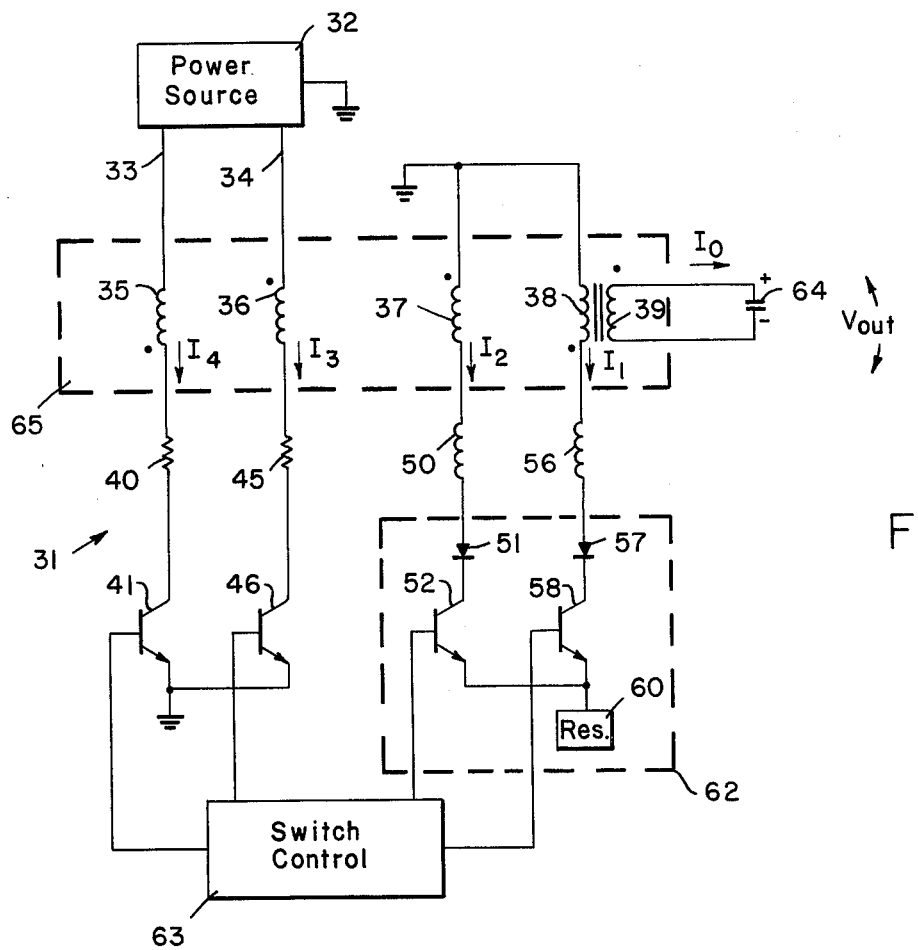
FIG. 3 is a schematic diagram of another embodiment showing a reactive drive circuit utilizing an alternate energy reservoir.

Referring now to FIG. 3, an improved reactive drive circuit 31 is shown. The primary difference between circuit 31 in FIG. 3 and the embodiment of FIG. 1 is that in the embodiment of FIG. 1 the coupling means for joining capacitive load 17 to the remainder of the circuit is a hard wired junction, while the coupling means in circuit 31 by which capacitive load 64 is joined to the inductors 50 and 56, switching network 62 and power source 32 is transformer 65.

In circuit 31, power source 32 consists of a pair of terminals, 33 and 34, which supply power to the circuit at voltage $V_2$. Terminal 33 is connected to primary winding 35 of transformer 65 so as to induce a negative voltage, $V_{out}$, across capacitive load 64 when current flows from the power source 32 through switching transistor 41. The outer end of winding 35 is connected to resistor 40, which in turn is connected to the collector of switching transistor 41. The emitter of switching transistor 41 is connected to ground. Switch control 63 then opens or closes switching transistor 41 by applying an appropriate voltage to its base. The second terminal 34 of power source 32 is connected to a second primary winding 36 so as to induce a positive voltage across capacitive load 64 when current flows from the power source 32 through switching transistor 46. The other end of primary winding 36 is connected to resistor 45 which in turn is connected to the collector of switching transistor 46. The emitter of switching transistor 46 is also connected to ground. Switch control 63 is connected to supply a second voltage to the base of switching transistor 46 to control its open-closed sequence.

A third primary winding 37 of transformer 65 is attached to ground at one end and inductor 50 at the other and is oriented to induce an increase in voltage across capacitive load 64 when current is permitted to flow through inductor 50. The other terminal of inductor 50 is connected to diode 51 in switching network means 62. Diode 51 is connected to the collector of switching transistor 52 whose emitter is connected to a constant voltage energy reservoir 60 at zero volts. Switch control 63 is connected to supply a third voltage pulse to the base of switching transistor 52 to either open or close switching transistor 52.

A fourth primary winding 38 of transformer 65 is attached between ground and inductor 56 and is oriented to induce a decrease in voltage across the capacitive load when current is permitted to flow through inductor 56. The other terminal of inductor 56 is joined to diode 57 which in turn is connected to the collector of switching transistor 58. The emitter of switching transistor 58 is connected to the constant voltage energy reservoir 60 at zero volts. Switch control 63 is coupled to the base 60 of switching transistor 58 and provides a fourth voltage pulse to open or close switching transistor 58. Secondary winding 39 of transformer 65 is connected in parallel with capacitive load 64.

The operation of the reactive drive circuit 31 of FIG. 3 is best explained by reference to FIG. 5. For the sake of simplicity, the turns ratios of the various windings of transformer 65 are assumed to be unity. However, it will be appreciated that the relationshiip between the voltage of the power source and the maximum output voltage will be in direct proportion to the turns ratio of the transformer if a turns ratio other than unity is utilized. Initially, circuit 31 is in an ambient state and has no energy stored in any component. Switch 46 is then closed at time $t_0$, allowing current to flow from terminal 34 of power source 32 through primary winding 36, resistor 45, and switching transistor 46. As current $I_3$ flows through primary winding 36, a current $I_0$ is induced in secondary winding 39 and capacitive load 64 commences to acquire a positive charge. The capacitive load 64 continues to charge until time $t_1$ when the voltage across the capacitive load 64 is equal to the source voltage $V_2$. At this time, the current $I_3$ ceases and the voltage across the capacitive load is maintained. Switching transistor 46 is then opened at time $t_3$ and at a subsequent time, $t_4$, switching transistor 58 is closed. With switching transistor 58 closed, current $I_0$ begins to flow through secondary winding 39 inducing current $I_1$ in primary winding 38 which allows energy to be transferred from the capacitive load 64 through inductor 56 where it is stored temporarily in the energy reservoir 60 which is a constant voltage source at zero volts in the particular embodiment. At time $t_5$ when the voltage across capacitive load 34 is zero, the maximum potential energy, ignoring losses, will be stored in inductor 56. As this energy is released, current flow is maintained and a charge is drawn from capacitive load 64 causing the voltage across capacitive load 64 to go negative. At time $t_6$, when the potential energy stored in inductor 56 has been entirely dissipated, the current tries to reverse itself to flow from the energy reservoir into the negatively charged capacitive load because the energy reservoir at zero volts is at a higher potential than the capacitive load 64. Such reverse current flow is prevented by diode 57. If there were no losses in the circuit, the voltage across the capacitive load 64 would reach $-V_2$ at time $t_6$. However, since there are losses in circuit 31, capacitive load 64 will not quite reach a negative voltage equivalent to $-V_2$, but will be at some smaller negative voltage, $-V_L$. This smaller negative voltage is maintained across the capacitive load 64 until switching transistor 41 is closed by switch control 63 at time $t_8$ after switch 58 is opened at time $t_7$. Because the voltage across capacitive load 64, mirrored through secondary winding 39 into primary winding 35, is less than the voltage appearing at terminal 33 of power source 32, current will flow from the power source 32 through primary winding 35 of transformer 65, thereby inducing an additional negative voltage across capacitive load 64. When the voltage across capacitive load 64, as mirrored through transformer 65, is equivalent to the voltage appearing at terminal 33 of power source 32, the current $I_4$ flowing through primary winding 35 ceases and the voltage across the capacitive load 64 will be $-V_2$. At time $t_9$, sometime after the voltage across the capacitive load 64 has reached a value of $-V_2$, switching transistor 41 is opened. At a subsequent time, $t_{10}$, another switching transistor 52 is then closed, allowing the negative charge across capacitive load 64 to discharge through secondary winding 39, inducing a current $I_2$ is primary winding 37. The current $I_2$ then flows through inductor 50, diode 51, and switch 52. Again, maximum potential energy will be stored in inductor 50 at time $t_{11}$ when the voltage across capacitive load 64 is zero since energy reservoir 60 is also at zero volts. This potential energy maintains the flow of current $I_2$, thereby causing capacitive load 64 to charge to a positive voltage above the voltage of energy reservoir 60.

Because of losses in circuit 31, the energy stored in inductor 50 will not be sufficient to induce a voltage across capacitive load 64 which is as great as the voltage of the power source $V_2$. However, since the voltage of the capacitive load 64 will be higher than the voltage of the energy reservoir, the current $I_2$ will attempt to reverse at time $t_{12}$ and flow through switching transistor 52, diode 51 and inductor 50. Such current flow is prevented by diode 51. Thus, a voltage, $+V_L$, slightly lower than the power source voltage $V_2$, will be maintained across capacitive load 64. Switching transistor 52 is then opened at time $t_{13}$ and at a subsequent time, $t_{14}$, switching transistor 46 is again closed. Because of the difference in voltage between the power source 32 and the capacitive load 64 as mirrored through secondary winding 39 into primary winding 36, a voltage drop appears across primary winding 36. Thus, when switching transistor 46 is closed, a current $I_3$ flows through winding 36 inducing a current $I_0$ in winding 39. This current flows until the capacitive load 64 has been fully charged so that the voltage $V_{out}$ across the capacitive load 64 is equal to the voltage $V_2$ supplied by power source 32. The operation of the reactive drive circuit 31 continues as the above switching reference is repeated in response to commands from switch control 63.

The reactive drive circuit 70 shown in FIG. 4 is a modified version of the reactive drive circuit 31 shown in FIG. 3. It eliminates the need for one of the primary transformer windings and one of the inductors at the expense of using a PNP transistor as a switch. Thus, in circuit 70, primary winding 37 is connected between ground and inductor 71. Inductor 71 is connected to the switching network 83 which comprises two unidirectional conductor branches. Reverse biased diode 73 in the first branch is connected to the collector of switching transistor 74. Switching transistor 74 is opened and closed in response to a voltage appearing at its base which originates from switch control 84. The emitter of switching transistor 74 is connected to the energy reservoir 75 which is a constant voltage source at zero volts in the present embodiment. Diode 78 in the second branch is connected to the collector of switching transistor 79. Switching transistor 79 is opened and closed in response to a voltage appearing at its base which originates from switch control 84. The emitter of switching transistor 79 is also connected to the energy reservoir 75. All other parts and functions of circuit 70 are identical to those of circuit 31 in FIG. 3.

Figure 5:
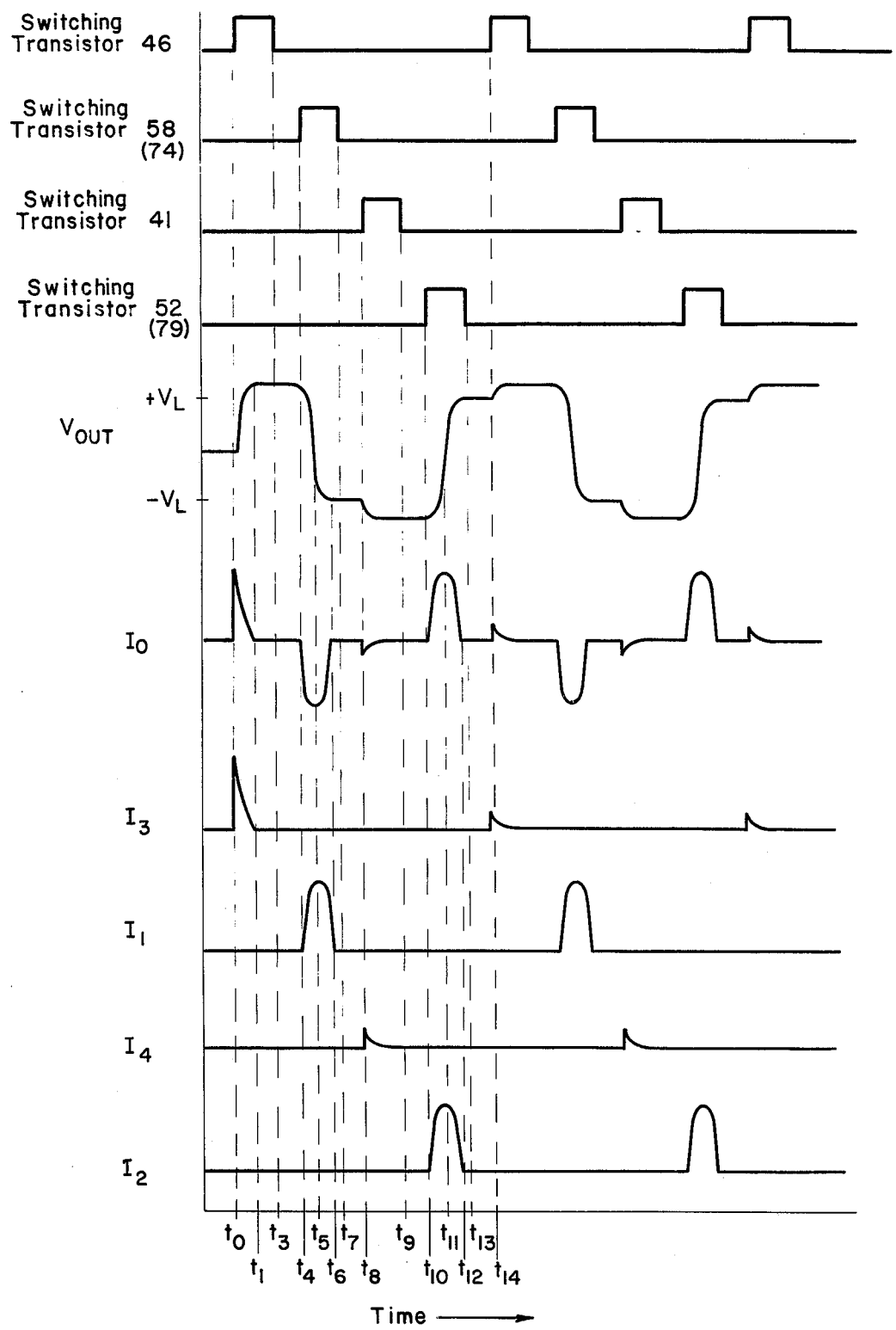
FIG. 5 is a graph showing the operating waveforms of the circuit of FIGS. 3 and 4.

Referring to FIG. 5, the operation of circuit 70 is identical to the operation of circuit 31 shown in FIG. 3 excepting only that the positive current $I_1$ in circuit 70 flows in the opposite direction of the positive current $I_1$ in circuit 31. Thus, in the graphs in FIG. 5 the graph of the open-closed sequence of switching transistor 58 in circuit 31 corresponds to that of switching transistor 74 in circuit 70 and the open-closed sequence of switching transistor 52 in circuit 31 corresponds to that of switching transistor 79 in circuit 70.

Figure 6:
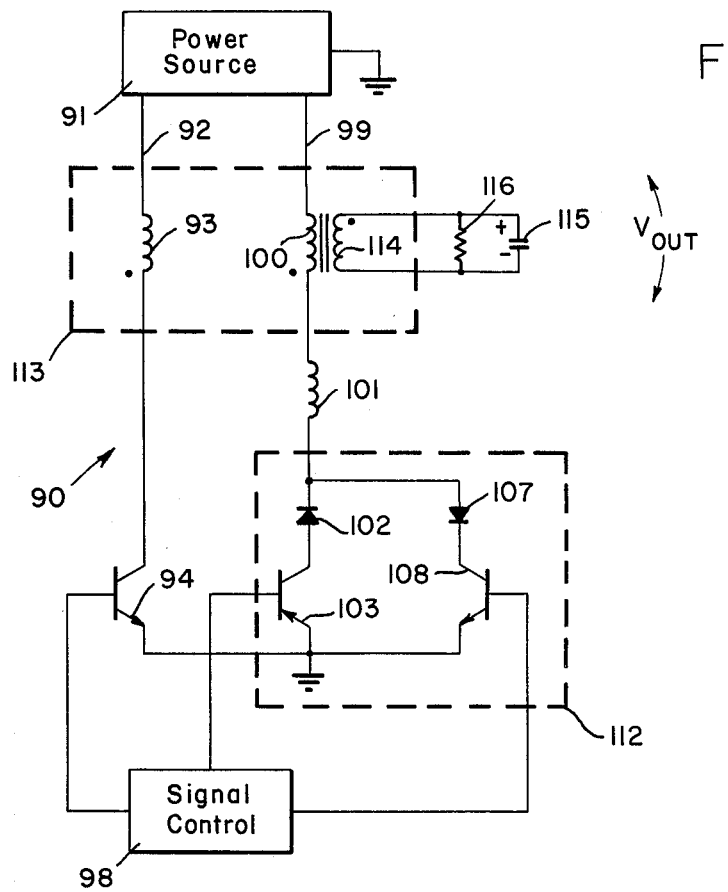
FIG. 6 is a schematic diagram of another embodiment suitable for use in low frequency applications.

Referring to FIG. 6, there is shown a reactive drive circuit 90 in accordance with the present invention which has particular application in clocking charge coupled devices (CCD) where very low frequencies are desired. Circuit 90 allows such low frequency operation while eliminating the need for one of the DC holding potentials on the transformer primary winding. Furthermore, the circuit 90 allows larger flexibility in variable frequency designs since the clocking frequency can range from very fast to very slow without changing any component values in the reactive drivers. Generally, the circuit 90 comprises power source 91, coupling transformer 113, inductor 101, switching means 112, switch control 98 and the switching transistor 94.

In circuit 90, power source 91 has two terminals, 92 and 99, each supplying voltage $V_2$ to individual primary windings of transformer 113. Connected between source terminal 92 and the collector of switching transistor 94 is primary winding 93. Switching transistor 94 is opened and closed in response to a voltage from external switch control 98 applied to its base. The emitter of switch 94 is connected to ground. Terminal 99 of power source 91 is connected to the series combination which comprises primary winding 100 of transformer 113, inductor 101 and switching network means 112.

The switching network means 112 comprises two unidirectional conducting branches. In one branch, there is diode 107 connected to the collector of switching transistor 108. The emitter of switching transistor 108 is connected to ground. Switching transistor 108 is opened or closed in response to a voltage supplied to its base by switch control 98. In the second branch of switching network 112 is diode 102 connected to the collector of switching transistor 103. The emitter of switching transistor 103 is connected to ground. Switching transistor 103 is opened or closed in response to a voltage supplied to its base by switch control 98. Inductor 101 and switching transistor 94 are coupled to the capacitive load 115 through transformer 113. Thus, the capacitive load 115 is in parallel with secondary winding 114 of transformer 113. Also in parallel with capacitive load 115 is resistor 116.

Figure 7:
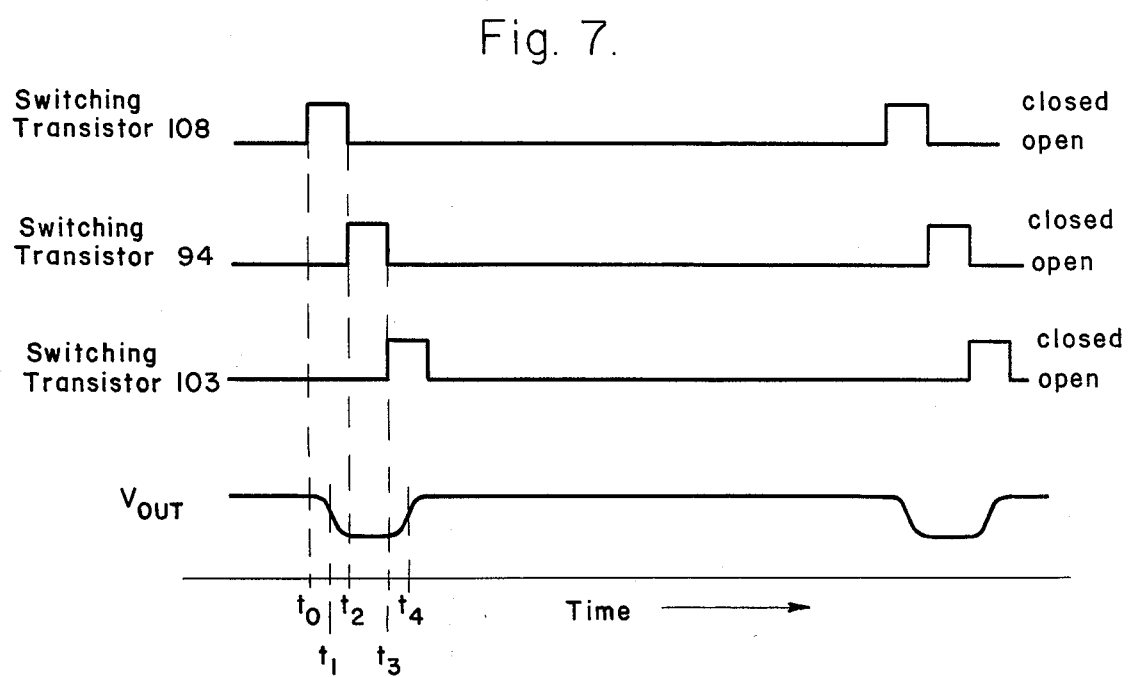
FIG. 7 is a graph showing the open-closed switching cycles and the resultant output voltage of the embodiment of FIG. 6.

While it is assumed for simplicity that primary winding 100 and secondary winding 114 have a one to one turns ratio, it will be appreciated that other turns ratio will result in proportional ratios between the output voltage and the source voltage. Furthermore, since the voltages appearing at terminals 92 and 99 are assumed to be equal, the turns of primary winding 93 must be twice that of primary winding 100. However, it will be appreciated that other ratios between the turns of primary windings 100 and 93 are possible if the voltage at terminal 92 is varied appropriately in relation to the voltage appearing at terminal 99. The operation of circuit 90 may be understood by reference to the graphs of FIG. 7. In the steady state condition, the voltage across capacitive load 115 is zero, with switching transistors 108, 103 and 94 open and nonconducting. Initially, at time $t_0$, switching transistor 108 is closed, allowing current to flow through inductor 101, forward diode 107, and switching transistor 108. Current through inductor 101 builds up until $t_1$ when the voltage across capacitive load 115, as reflected through tranformer 113, is equal to the voltage $V_2$ of the power source 91 which, in the present embodiment, is energy reservoir. At this time, maximum potential energy is stored in inductor 101. Consequently, current flow is maintained as the energy stored in the inductor is transferred back into the circuit. This continuation of current flow through inductor 101 induces an additional charge across capacitive load 115. Thus, at a time prior to the opening of switching transistor 108, the voltage across the capacitive load will be $-2V_2$ and the potential energy in inductor 101 will be zero. Because of the difference in potential between the capacitive load 115 and the power source terminal 99, current tries to reverse but is prevented by diode 107. Simultaneously with the opening of switching transistor 108 at time $t_2$, switching transistor 94 is closed. Thus, if the voltage across capacitive load 115 ever drops below $-2V_2$, current will flow through primary winding 93 to induce a current in secondary winding 114 to recharge capacitive load 115, thereby maintaining the voltage across the capacitive load 115 at $-2V_2$. When it is desired to discharge the capacitive load to zero volts, at $t_3$, switching transistor 94 is opened and switching transistor 103 is closed simultaneously. Because the capacitive load is charged to a voltage of $2V_2$ and the potential of power source 91 is $V_2$, the capacitive load 115 begins to discharge into the power source 91, which is the energy reservoir for circuit 90. The discharge of capacitive load 115 into power source terminal 99 induces a current to flow from ground through switch 103, diode 102, inductor 101 and primary winding 100. Current through inductor 101 again builds until the voltage across the capacitive load 115, as reflected through transformer 113, is equal to the voltage of the power source terminal 99. At this time, $t_4$, maximum potential energy is stored in inductor 101. Thus, current continues to flow as that energy is subsequently released into the circuit. This continued current flow pulls additional charge from capacitive load 115 causing it to discharge to zero volts. Losses in the circuit are represented by the power dissipated in resistor 116 while the voltage across capacitive load 115 reaches exactly zero. The time during which the output voltage is not at zero volts serves as a transfer pulse for the transfer of data in CCD devices.

Figure 8:
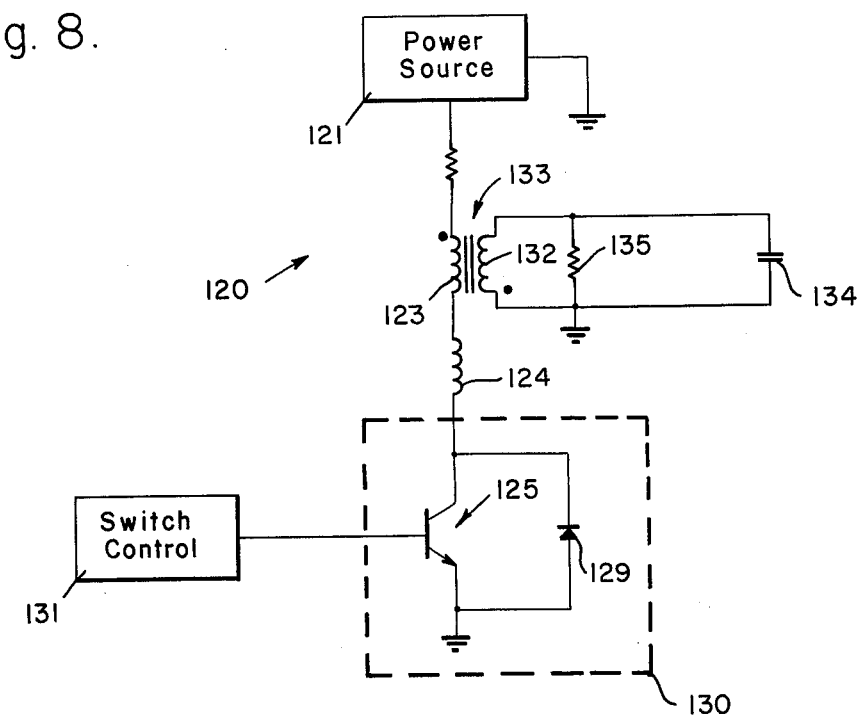
FIG. 8 is a schematic of a modification of the reactive drive circuit of FIG. 6.

Certain applications exist where clocking waveforms for CCD devices become simplified to the point where the timing of the rising and the falling edges is not important. Additional simplifications can consequently be made in the reactive drive circuit represented in FIG. 6. Such a simplification appears in FIG. 8 as reactive drive circuit 120. In the reactive drive circuit 120, power source 121 at voltage $V_2$ is connected to the series combination which comprises primary winding 123 of transformer 133, inductor 124 and switching network means 130. Switching network means 130 comprises switching transistor 125 and diode 129 in parallel, wherein switching transistor 125 is opened or closed in response to a voltage generated by switch control 131 and applied to the base of switching transistor 125. Switching transistor 125 is oriented to allow current to flow from the inductor through switch 125 to ground. Diode 129 is connected between the collector and the emitter of switching transistor 125 and is oriented to allow current to flow in only one direction opposite to the direction of current flow through switching transistor 125. Secondary winding 132 of transformer 133, a resistor 135, and capacitive load 134 are connected in parallel with one side being grounded. It will be appreciated that primary winding 123 and secondary winding 132 may be oriented to cause either a positive or negative voltage pulse to appear across the capacitive load. Furthermore, the ratio between the maximum voltage appearing across the capacitive load and the DC voltage at the power source may be varied in proportion to the turns ratio between primary winding 123 and secondary winding 132 of transformer 133.

Figure 9:
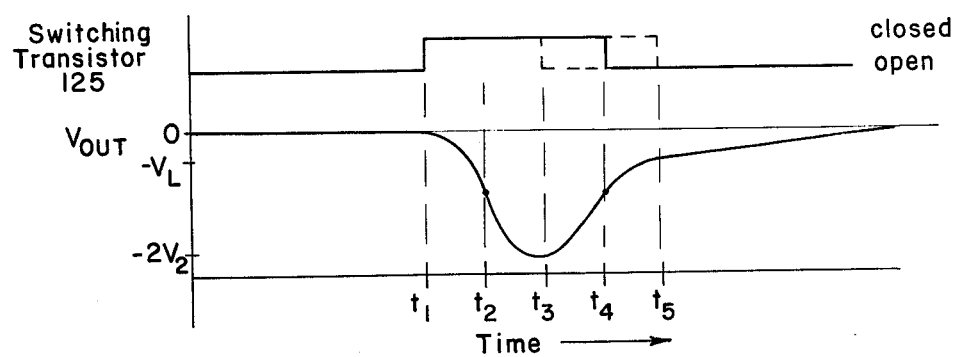
FIG. 9 is a graph showing the output voltage waveform in response to the opening and closing of the switch in the embodiment of FIG. 8.

In essence, circuit 120 is a type of pulse generator that recovers energy while forming a voltage pulse that transfers data in devices such as charge coupled devices. The operation of circuit 120 may be understood by reference to the graphs in FIG. 9 wherein the open-closed sequence of switching transistor 125 and the resultant voltage appearing at terminal 136, designated $V_{out}$, are shown. Initially, the voltage across capacitive load 134 is zero volts. At time $t_1$, switch 125 is closed in response to a pulse from switch control 131 to base 127. Since there is no voltage across capacitive load 134, current begins to flow through primary winding 123, inductor 124, and switching transistor 125. This induces a current in secondary winding 132 which in turn causes a voltage to begin to build up across capacitive load 134. The voltage across capacitive load 134 continues to build until the value of the voltage $V_{out}$, as reflected through transformer 133, is equal to the voltage $V_2$ of the power source 121. At this time, $t_2$, maximum potential energy is stored in inductor 124. Current flow through primary winding 123 continues as this potential energy is subsequently released, thereby charging the capacitive load 134, until $t_3$, when all of the potential energy stored in inductor 124 has been dissipated and the voltage across the capacitive load is $-2V_2$ volts less any circuit losses. Current through inductor 124 then tries to reverse because of the difference in potential between the capacitive load 134 as reflected through transformer 133 and the power source voltage $V_2$. Unlike the previous embodiments, this reverse current is not prevented from flowing but is allowed to flow through diode 129. Since switch 125 is not conducting, it may be opened at any time between $t_3$ and $t_5$ when the entire reverse current is flowing through diode 129. Because current is allowed to flow through inductor 124 in the reverse direction, the voltage across capacitive load 134 begins to discharge into power source 121, which serves as the energy reservoir in circuit 120. At time $t_4$ maximum potential energy is again stored in inductor 124. Again, because of the potential energy stored in inductor 124, the capacitive load 134 is forced to discharge into the power source 121 and to acquire a value of voltage, as viewed through transformer 133, which is below the power source voltage $V_2$. If there were no losses in circuit 120, the capacitive load 134 would be forced to discharge until the voltage appearing at terminal 136 was zero. However, because of losses in the circuit the energy stored in inductor 124 will not be sufficient to cause capacitive load 134 to fully discharge into power source 121. Thus, at $t_5$, the time when the potential energy in inductor 124 has been dissipated, the voltage across capacitive load 134 will be $-V_L$ (or $+V_L$ as reflected through transformer 133). At this time, the current again tries to reverse itself because of the difference in potential between the capacitive load 134 and power source terminal 122. However, such current is prevented from flowing through primary winding 123 because switching transistor 125 has been opened. The voltage across capacitive load 134 would be maintained at $-V_L$ until switch 125 was again closed; however, resistor 135 connected in parallel with capacitive load 134 continues to return the voltage across the capacitive load 134 to zero. This is accomplished by allowing the capacitive load 134 to discharge from $-V_L$ to ground through resistor 135.

Figure 10:
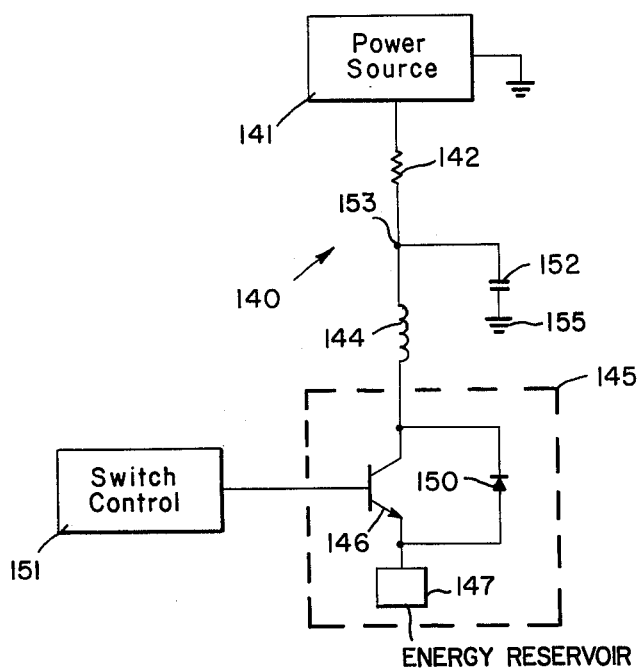
FIG. 10 is a schematic diagram of another embodiment of the present invention suitable for very small capacitive loads.

In some cases, those circuits previously presented may have such small values of inductance due to small capacitive loads, that it is not possible to use transformer coupling. Circuit 140, shown in FIG. 10, represents a reactive drive circuit where the capacitive load 152 is coupled to the inductor and switching network 145 by a simple hard wired connection. The reactive drive circuit 140 comprises a power source 141 supplying voltage at $+V_2$ volts and the series combination which comprises resistor 142, inductor 144 and the switch network means 145. Switching network means 145 comprises a switching transistor and a reverse biased diode in parallel and is identical to the switching network means 130 for circuit 120 disclosed in FIG. 8. The emitter of switching transistor 146 is connected to the energy reservoir 147 which is a constant zero voltage source in this particular embodiment and the switching transistor 146 is controlled by switch control 151.

Figure 11:
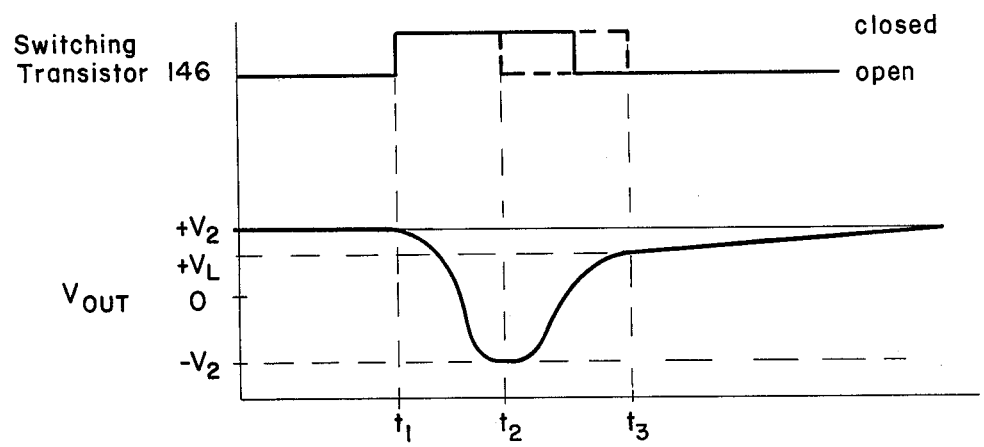
FIG. 11 is a graph showing the response of the circuit in FIG. 10 when the switch is closed.

The operation of the reactive drive circuit 140 may be understood by reference to FIG. 11 which shows a graph of the voltage appearing across the capacitive load in response to the opening and closing of switching transistor 146. Initially, switching transistor 146 is open and capacitive load 152 is charged to a voltage of $+V_2$.

At time $t_1$, switching transistor 146 is closed allowing current to flow through inductor 144, and switching transistor 146 into energy resistor 147 at zero volts. As capacitive load 152 is discharged, energy is stored in inductor 144 until the voltage across the capacitive load 152 is also at zero volts. Since there is no potential difference between the capacitive load voltage and the voltage of the energy reservoir 147 into which the capacitive load is discharging, the current through switching transistor 146 would normally cease. However, at this time, maximum potential energy is still stored in inductor 144. At this potential energy is injected into the circuit, current flow through switch 146 is maintained until time $t_2$ when the total energy stored in inductor 144 has been dissipated. At this time, the voltage across capacitive load 153 would lie slightly less negative than $-V_2$ volts because of circuit losses. Since there is now a potential difference between terminal 153 and ground 155, current reverses itself and is allowed to flow through diode 150. Switching transistor 146 may be opened at any time between time $t_2$ and time $t_3$ while the entire current is flowing in the reverse direction through diode 150. Again, when the voltage drop across capacitive load 152 is zero, there is no potential difference between the capacitive load voltage and the voltage of the energy reservoir 147. However, reverse current is maintained as the potential energy stored in inductor 144 is dissipated. Because circuit 140 has losses, the voltage across capacitive load 152 will not quite reach $+V_2$, but instead will reach a somewhat lower voltage designated by $V_L$ in FIG. 11. The current again tries to reverse itself and flow from capacitive load 152 to ground 155. However, this time such current is not allowed to flow because switch 146 has been opened and voltage $V_L$ is consequently maintained across capacitive load 152. Inherent losses of circuit 140 are replaced from power source 141 through resistor 142 after $t_3$. Thus, capacitive load 152 slowly recharges after time $t_3$ from $V_L$ volts to $V_2$, at which time no further current flows through resistor 142 to charge capacitive load 152.

While all voltages in the preferred embodiments have been referenced to either $V_2$ or ground, it will be appreciated that various bias voltages may be incorporated without departing from the spirit of the present invention. Furthermore, in circuits 90, 120 and 140 it will be appreciated that the resistors 116, 135 and 142 respectively may be replaced by control switches for greater efficiency of operation.

What is claimed is:

1. A reactive drive circuit for driving a capacitive load comprising in combination:
   (a) inductive means;
   (b) an energy reservoir;
   (c) switching network means, said switching network comprising first and second oppositely poled unidirectional conducting branches at least one branch of which includes a controllable switch;
   (d) switch control means coupled to said switching network means for controlling the opening and closing of said controllable switch; and
   (e) wherein said inductive means, said energy reservoir and said switching network means are coupled in series with one another and are coupled to said capacitive load such that said capacitive load is discharged through said inductive means and said first conducting branch into said energy reservoir; and said capacitive load is charged primarily by energy reapplied thereto from said energy reservoir through said second conducting branch and said inductive means.

2. The reactive drive circuit according to claim 1 wherein:
 (a) the first branch of said switching network means comprises a transistor switch circuit; and
 (b) the second branch of said switching network means comprises a unidirectional conducting diode device.

3. The reactive drive circuit according to claim 2 further comprising a power supply and a resistor coupled between said power supply and said capacitive load.

4. A reactive drive circuit according to claim 1 wherein the energy reservoir comprises a substantially constant voltage source.

5. The reactive drive circuit according to claim 1 wherein the relative parameter values of said inductive means and said capacitive load are such that the value of the voltage of the energy reservoir is substantially equal to the midpoint of the voltage swing appearing across the capacitive load.

* * * * *

UNITED STATES PATENT AND TRADEMARK OFFICE
CERTIFICATE OF CORRECTION

PATENT NO. : 4,109,192
DATED : August 22, 1978
INVENTOR(S) : Ronald B. Burbank, et al It is certified that error appears in the above-identified patent and that said Letters Patent are hereby corrected as shown below:

Column 4, lines 18 and 29, "$(V_1+V_2)/2$" should be -- $(V_1+V_2)$

Column 4, line 53, delete "energy will be supplied by" and insert --current will be induced to flow from--.

Signed and Sealed this

Twenty-fourth Day of April 1979

[SEAL]

Attest:

RUTH C. MASON
Attesting Officer

DONALD W. BANNER
Commissioner of Patents and Trademarks